Nov. 24, 1964 J. E. SANDOR 3,158,505
METHOD OF PLACING THICK OXIDE COATINGS ON SILICON AND ARTICLE
Filed July 23, 1962
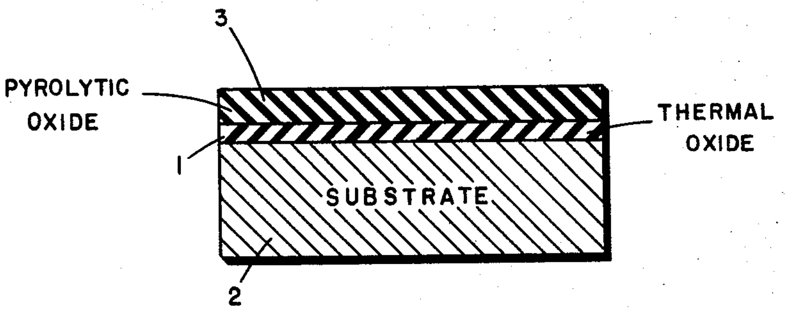
JOSE E. SANDOR
*INVENTOR.*
BY [signature]
*ATTORNEY*

United States Patent Office 3,158,505

Patented Nov. 24, 1964

3,158,505

METHOD OF PLACING THICK OXIDE COATINGS ON SILICON AND ARTICLE

José Esteban Sándor, Menlo Park, Calif., assignor to Fairchild Camera and Instrument Corporation, Syosset, N.Y., a corporation of Delaware Filed July 23, 1962, Ser. No. 211,857
4 Claims. (Cl. 117—215)

This invention provides a means of putting a thick oxide coating on silicon. Thick oxide coatings are desirable to provide greater protection for the junctions in a semiconductor as well as to reduce the capacitance between the semiconductor body and any leads running above the oxide layer.

Silicon semiconductor devices are often protected by a coating of silicon dioxide. This coating serves to protect the device, particularly the junctions, from damage during and after manufacture. Thin layers of silicon dioxide adhere strongly to the silicon crystal and therefore are eminently satisfactory for this purpose. In some instances, metal electrodes or leads are deposited on top of the oxide coating. These electrodes make contact with the body of semiconductor through holes etched in the oxide layer.

It is very desirable to have the oxide coating thick. First, a thick oxide coating provides more protection of the junctions beneath the oxide. This is particularly important where electrical connections are to be deposited on the oxide surface by vacuum evaporation and deposition of a metal. If the oxide is too thin, the hot metal being deposited pierces the oxide and makes an undesired contact with the semiconductor surface. This ruins the device.

Second, the metal connections on the surface of the oxide form a capacitor with the silicon surface. The oxide, an insulator, is the dielectric. This capacitor becomes part of the semiconductor circuit. When the semiconductor is used as a switch, the time required to charge and discharge the capacitor seriously decreases the switching speed. Where the semiconductor is to be used in an amplifier circuit, this capacitor is particularly harmful in high frequency operation. The amount of capacitance can be substantially reduced by using as thick an oxide layer as possible.

The most common method of growing oxide films on silicon semiconductor devices is thermal oxidation. Briefly, this involves heating the silicon in an oxidizing atmosphere at a temperature of about 900–1,300° C. The oxidizing agent in the atmosphere penetrates the crystal lattice at the surface of the wafer, and the oxygen combines chemically with the surface silicon atoms to form silicon dioxide. This method, however, is not satisfactory for growing an oxide layer over about 15,000 A. thick. As the oxide becomes thicker, it masks the surface of the wafer. This prevents the oxidizing agent from contacting the silicon to cause further oxidation. Consequently, once about a 15,000 A. layer has been grown, the process slows for all practical purposes to a halt. Further heating causes more decomposition of the oxide already formed than formation of additional oxide, and may even crack and damage the previously formed layer.

Another process used for oxide formation is called pyrolytic growth. In this process, an oxide of silicon is deposited from the vapor state of the silicon wafer. The oxide is formed by the decomposition of a silicon compound having an Si-O bond, such as a siloxane or an organic silicate. The oxide is substantially similar in appearance to thermally grown oxide. However, pyrolytic oxides are more easily attacked by chemical oxide etchants. This makes photoengraving of the oxide coating for electrode deposition easier, but also indicates that the pyrolytic oxide may be more porous, and therefore may give less protection to the substrate than thermally grown oxide layers. Thick pyrolytic oxide deposits, moreover, are no more satisfactory than thermally grown deposits. When pyrolytic oxides are deposited in a layer thicker than about 12,000 A., they begin to crack, peel, and hence become generally unsatisfactory.

A new method has now been discovered by which a thicker oxide coating can be applied to a silicon wafer than was heretofore possible by either of the above prior-art methods. This method uses a thermally grown layer of oxide between about 3,000 and 15,000 A., preferably 6,000–12,000 A., thick, covered by a second, pyrolytically grown layer of essentially any desired thickness. It was surprisingly found that a much thicker pyrolytic oxide layer could be deposited on top of the thermally grown layer than could be deposited directly on bare silicon without cracking. Pyrolytic layers of as much as 90,000 A. have been deposited on a thermally grown layer of about 10,000 A. according to the invention, to make a total oxide layer of 100,000 A. These thicker pyrolytic layers deposited on thermally grown oxide exhibited none of the cracking and peeling heretofore observed where pyrolytic oxide layers were deposited on bare silicon.

In more detail, referring to FIG. 1 of the drawing showing a cross-sectional view of a device produced by the invention, the method of the invention begins by thermally growing a layer of silicon dioxide 1 on the surface of the silicon substrate 2. This layer is to be at least about 3,000 A. thick—about 15,000 A. can be stated as a practical upper limit because of the time required to obtain thicker coatings, and because cracking occurs when thicker thermally grown layers are attempted. The method used to grow this layer is heating the silicon substrate in an oxidizing atmosphere, such as oxygen, air, water vapor, or the like. Water vapor systems are generally preferred. By heating the substrate to temperatures from about 900–1,300° C. for a sufficient period of time, the oxide layer is grown. To obtain a 10,000 A. layer at about 1,200° C., for example, about 1½ hours is required. The particular time and temperature used is a matter of choice for the practitioner. Further details of the process can be found in Frosch and Derick, Surface Protection and Oxide Masking During Diffusion in Silicon, J. Electrochem. Soc., vol. 104, pp. 547–552, 1957.

The pyrolytic growth of the second layer 3 is carried out by subjecting the substrate with the thermally grown oxide layer to an atmosphere where a volatile silicon compound is being thermally decomposed. This decomposition should occur below the melting point of the substrate or else the substrate would be destroyed in the process. In addition, the compound to be decomposed must be sufficiently stable to prevent its own decomposition before reaching the substrate.

There is a large group of organic derivatives of silicon called siloxanes from which silicon dioxide can be obtained by thermal decomposition. These substances may be considered to be derived from the silicon halides, such as silicon tetrachloride, through replacement of the halogen by oxy-groups. They therefore contain one or more Si-O-R bonds in the molecule. R can be alkyl, aryl, alkaryl, aralkyl, or mixtures thereof. Examples of such compounds include tetraethoxysilane, ethyltriethoxysilane, amyltriethoxysilane, vinyltriethoxysilane, phenyltriethoxysilane, dimethyldiethoxysilane, diphenyldiethoxysilane, dimethyldimethoxysilane, diethyldimethoxysilane, ethyl silicate, methyl silicate, and other commercially available compounds containing the Si-O bond.

The pyrolytic layer is deposited by heating the substrate in a suitable furnace to a temperature between about 600° and 900° C., preferably about 700°–800° C. Too low a temperature decreases the rate, and too high a temperature causes undesirable deposits upon the substrate. If desired, deposition can be carried out using an inert carrier gas, e.g., nitrogen, which is flushed through the furnace. Alternatively, an evacuated system can be employed where the silicon source is fed from a container maintained essentially at room temperature. Because of the relatively high volatility of the silicon compounds, the vacuum pulls the vapor from the source even at room temperature. The deposition time varies according to the temperature and thickness desired. At about 750° C., for example, a 30,000 A. thick layer can be grown in about 1½ to 2 hours. If desired, the finished pyrolytic layer may be oxidized to eliminate any silicon carbide formed during deposition.

To further illustrate the substantial increase in oxide thickness obtainable by the method of the invention, the following comparative example is presented. However, this example uses merely one set of conditions and is not to be construed as placing further limitations upon the scope of the invention broadly described above.

*Example*

A substrate of silicon was cleaned and placed in a furnace heated to about 1200° C. in the presence of water vapor, for about 1½ hours. A thermally grown layer of silicon dioxide was formed on the surface. Its thickness was measured by interference microscopy and found to be about 10,000 A. This coated substrate was then placed in a vacuum furnace for pyrolytic growth. Ethyl silicate was introduced from a liquid supply vessel into the system at room temperature. It vaporized upon entering the vacuum and was deposited upon the substrate. A vacuum of 30 microns and a substrate temperature of about 750° C. was maintained for about 50 minutes. The thickness of pyrolytic growth was measured after about 1⅔ hours and found to be about 30,000 A. making a total oxide coating of about 40,000 A. thick.

To check the oxide layer for defects and cracks, the coated sample was put into a furnace heated to about 900° C. A steady flow of chlorine gas was directed into the furnace for about 20 minutes. This technique is very effective for qualitatively screening films for cracks or pores. Imperfections not visible to the naked eye are easily detected by looking at the chlorine stains in a microscope. No cracking was observed in the oxide layer deposited according to the invention.

This same experiment was repeated, except that the thermally grown oxide layer was omitted. Substantial cracking was found in the pyrolytic oxide layer. The pyrolytic oxide mask formed would not effectively protect the silicon against diffusion. Any device made from silicon coated only with a thick pyrolytic layer would probably be unsatisfactory. This comparative example clearly demonstrates that the method of this invention makes possible the formation of a thick and uniform pyrolytic oxide layer, and a uniform oxide coating of greater thickness than heretofore possible by pyrolytic oxide coating alone.

It is apparent to one skilled in the art that many modifications and variations could be made in the process of the invention without departing from the spirit and scope of the inventive concepts described above. Therefore the only limitations to be placed on the scope of the invention are found in the following claims.

What is claimed is:

1. A method of obtaining silicon oxide layers upon a silicon substrate which comprises:

growing a first layer of silicon oxide on said substrate by exposing said substrate to heat in an oxidizing atmosphere of at least 3,000 A. in thickness; and pyrolytically growing a second layer of silicon oxide upon said first layer.

2. Method of claim 1 wherein said thermally grown layer is between about 3,000 A. and 15,000 A. thick.

3. Method of claim 1 wherein said thermally grown layer is between about 6,000 A. and 12,000 A. thick.

4. The product produced according to the method of claim 1.

References Cited by the Examiner

UNITED STATES PATENTS

| | | | |
|---|---|---|---|
| 2,802,760 | 8/57 | Derick et al. | 156—17 |
| 2,899,344 | 8/59 | Atalla et al. | 156—17 |
| 2,995,473 | 8/61 | Levi | 156—17 |
| 3,055,776 | 9/62 | Stevenson et al. | 117—106 |
| 3,095,341 | 6/63 | Ligenza | 156—17 |
| 3,114,663 | 12/63 | Klerer | 117—201 |

RICHARD D. NEVIUS, *Primary Examiner.*